(12) United States Patent
Zou et al.

(10) Patent No.: US 9,328,961 B2
(45) Date of Patent: May 3, 2016

(54) CRUCIBLE OF COATING MACHINE

(71) Applicant: Shenzhen China Star Optoelectronics Technology Co., Ltd., Shenzhen, Guangdong (CN)

(72) Inventors: Qinghua Zou, Shenzhen (CN); Tai-Pi Wu, Shenzhen (CN)

(73) Assignee: Shenzhen China Star Optoelectronics Technology Co., Ltd, Shenzhen, Guangdong (CN)

(*) Notice: Subject to any disclaimer, the term of this patent is extended or adjusted under 35 U.S.C. 154(b) by 379 days.

(21) Appl. No.: 14/117,031

(22) PCT Filed: Sep. 3, 2013

(86) PCT No.: PCT/CN2013/082853
§ 371 (c)(1),
(2) Date: Nov. 11, 2013

(87) PCT Pub. No.: WO2015/024280
PCT Pub. Date: Feb. 26, 2015

(65) Prior Publication Data
US 2015/0111165 A1    Apr. 23, 2015

(30) Foreign Application Priority Data
Aug. 23, 2013 (CN) .......................... 2013 1 0372062

(51) Int. Cl.
*F27B 14/06* (2006.01)
*F27B 14/10* (2006.01)
*C23C 14/12* (2006.01)
*C23C 14/24* (2006.01)

(52) U.S. Cl.
CPC ................ *F27B 14/10* (2013.01); *C23C 14/12* (2013.01); *C23C 14/243* (2013.01); *F27B 2014/104* (2013.01)

(58) Field of Classification Search
CPC .................................. F27B 14/06; F27B 14/08
USPC .............. 432/156, 262; 219/50, 56, 200, 209, 219/390, 420, 424, 406; 65/347; 126/284
See application file for complete search history.

(56) References Cited

U.S. PATENT DOCUMENTS

| | | | | |
|---|---|---|---|---|
| 1,394,954 A * | 10/1921 | Van Aller | ............. | H05B 3/0014 219/421 |
| 1,523,647 A * | 1/1925 | Imhoff | ..................... | C23C 2/003 219/424 |
| 1,535,307 A * | 4/1925 | Hawk | ....................... | H05B 3/00 219/421 |
| 1,623,209 A * | 4/1927 | Schuster | .............. | H05B 3/0014 219/421 |
| 2,190,135 A * | 2/1940 | Morgan | ............... | B23K 3/0646 219/421 |
| 2,357,845 A * | 9/1944 | Nordquist | ............... | B29C 67/24 100/328 |

(Continued)

*Primary Examiner* — Gregory A Wilson
(74) *Attorney, Agent, or Firm* — Andrew C. Cheng

(57) ABSTRACT

The present invention provides a crucible of a coating machine The crucible includes a heat conduction device installed inside the crucible. The heat conduction device includes one or multiple radial metal wires or metal strips disposed along a radial direction of the crucible, and one or multiple axial metal wires or metal strips disposed along an axial direction of the crucible. By the heat conduction device formed by metal wires or metal strips, it can achieve a better heat conduction such that the heating temperature of the organic material placed in the crucible is uniform to achieve the steady state of thermal equilibrium. And the crucible can fill more material, increase evaporation rate, decrease the number of refilling the material, and improve production efficiency.

8 Claims, 3 Drawing Sheets

(56) References Cited

U.S. PATENT DOCUMENTS

| | | | | |
|---|---|---|---|---|
| 2,463,329 | A * | 3/1949 | Stansbury | A61H 33/04 219/207 |
| 3,392,970 | A * | 7/1968 | Falk | B01L 3/04 219/634 |
| 4,052,153 | A * | 10/1977 | Borer | F27B 3/04 219/634 |
| 4,590,043 | A * | 5/1986 | Sanjurjo | C01B 33/033 117/223 |
| 7,962,016 | B2 * | 6/2011 | Choe | C23C 14/243 118/726 |
| 8,461,761 | B2 * | 6/2013 | Neate | H01J 65/044 313/161 |
| 8,696,350 | B2 * | 4/2014 | Ohara | B22F 3/003 219/407 |
| 2005/0175064 | A1 * | 8/2005 | Keough | F27B 14/063 373/151 |
| 2009/0211518 | A1 * | 8/2009 | Kato | C30B 15/10 117/206 |
| 2009/0288592 | A1 * | 11/2009 | Kato | C30B 15/10 117/206 |
| 2010/0059499 | A1 * | 3/2010 | Lewin | F27D 99/0006 219/420 |

* cited by examiner

CRUCIBLE OF COATING MACHINE

The claims of this application have submitted to the State Intellectual Property Office of the People's Republic of China (SIPO) on Aug. 23, 2013, Application No. 201310372062.0. The priority right based on the China application has a title of "Crucible of coating machine" The entire contents of the above-mentioned patent application will be incorporated in the present application through citing.

BACKGROUND OF THE INVENTION

1. Field of the Invention

The present invention relates to an image display field, and more particular to a crucible of a coating machine 2. Description of Related Art The organic electroluminescence device is a self-emitting device with low voltage, wide viewing angle, quick response speed, temperature adaptability and other advantages, and it is a new generation of the display technology.

From the point of view of the molecular mass of the organic electroluminescence material, the organic electroluminescence device can be divided into the organic electroluminescence device with small molecular mass (OLED) and the organic electroluminescence device with large molecular mass (PLED). Because the molecular mass is different, the manufacturing process is also great different. The OLED is mainly manufactured through thermal evaporation method, and the PLED is manufactured by spin coating or inkjet printing method.

The thermal evaporation method is mainly heating the organic material in a vacuum environment (E-5 Pa) so that the sublimation type or the melt type organic material is vaporized at high temperature, and is depositing on a substrate having a thin film field effect transistor TFT structure or an anode structure. The evaporation source is mainly divided into a point type evaporation source or a linear type evaporation source. The point type evaporation source is small in space, and a coating chamber can install many point type evaporation sources so that it can fill a variety of materials inside the coating chamber. The point type evaporation source is mainly used in an experimental production line and an early mass production line. Since the material utilization rate and the thickness uniformity of the linear type evaporation source are better than the point type evaporation source, most of mass production line constructed recently utilizes the linear evaporation source.

The difference of the evaporation temperature and the degradation temperature of the organic material is very small. The temperature difference in the interior of the crucible with the point type evaporation source is usually larger (hot at the upper portion and cold at the lower portion). If the amount of the material filled into the chamber is larger, the material cannot reach a steady state of thermal equilibrium so that the evaporation rate cannot be stabilized. If it increases the temperature to make the material reach a steady state of thermal equilibrium, it often causes the material at the upper portion to be in the risk of degradation. If the amount of the material filled into the chamber is less, at high evaporation rate, the temperature at the upper portion of the crucible often exceeds the degradation temperature of the material, and the vaporized material is easy to degrade.

To solve the above problem, it often utilizes thermal conductive balls. It mixes the thermal conductive balls when the organic material is filled in the crucible. Through the heat conduction of the thermal conductive balls, it makes the temperature of the material uniform. However, the above method is only useful for the sublimation type material. The melt type material is melted at a high temperature, and because the density of the thermal conductive balls is different from the density of the organic material, the thermal conductive balls will be gradually deposited on the bottom of the crucible such that they cannot conduct heat well.

SUMMARY OF THE INVENTION

The main object of the present invention is to provide a crucible of a coating machine to decrease the temperature difference in the interior of the crucible, improve heat conduction efficiency, and make the heating temperature of the material be more uniform.

In order to solve the above technical problems, a technical solution provided by the present invention is: a crucible of a coating machine comprising: a heat conduction device installed inside the crucible, and having one or multiple radial metal wires or metal strips disposed along a radial direction of the crucible; and one or multiple axial metal wires or metal strips disposed along an axial direction of the crucible.

Wherein, the radial metal wires or metal strips are vertical to or substantially vertical to a main axis of the crucible, and the axial metal wires or metal strips are parallel with or substantially parallel with the main axis of the crucible.

Wherein, the multiple radial metal wires or metal strips form a planar honeycomb structure by at least two polygons at a radial plane of the crucible.

Wherein, the planar honeycomb structure is disposed as at least two layers along the axial direction of the crucible, and the multiple axial metal wires or metal strips are connected with intersections corresponding to each side of the polygons of the two adjacent layers of the planar honeycomb structure in order to form a three-dimensional honeycomb structure.

Wherein, the radial metal wires or metal strips form the planar honeycomb structure by weaving or welding, and the axial metal wires or metal strips are connected with the intersections corresponding to each side of the polygons of the two adjacent layers of the planar honeycomb structure by weaving or welding in order to form the three-dimensional honeycomb structure.

Wherein, a percentage P of a volume of internal pores of the heat conduction device to a total volume of the heat conduction device satisfies: $10\% < P < 99\%$.

Wherein, $80\% < P < 95\%$.

Wherein, at least one of the radial metal wires or metal strips and the axial metal wires or metal strips is contacted with an inner wall of the crucible.

Wherein, the polygon is a pentagon, a hexagon, an octagonal or an irregular polygon.

Wherein, the materials of the radial metal wires or metal strips and the axial metal wires or metal strips are aluminum, aluminum alloy, titanium alloy, or copper alloy.

In order to solve the above technical problems, another technical solution provided by the present invention is: A crucible of a coating machine comprising: a heat conduction device installed inside the crucible, and having one or multiple radial metal wires or metal strips disposed along a radial direction of the crucible; and one or multiple axial metal wires or metal strips disposed along an axial direction of the crucible; wherein, the multiple radial metal wires or metal strips form a planar honeycomb structure by at least two polygons at a radial plane of the crucible; the planar honeycomb structure is disposed as at least two layers along the axial direction of the crucible; the multiple axial metal wires or metal strips are connected with intersections corresponding to each side of the polygons of the two adjacent layers of the planar honeycomb structure in order to form a three-dimensional honeycomb structure.

In order to solve the above technical problems, another technical solution provided by the present invention is: a crucible of a coating machine comprising: a heat conduction device installed inside the crucible, and having one or multiple radial metal wires or metal strips disposed along a radial direction of the crucible; and one or multiple axial metal wires or metal strips disposed along an axial direction of the crucible; wherein, at least one of the radial metal wires or metal strips and the axial metal wires or metal strips is contacted with an inner wall of the crucible.

The crucible of a coating machine provided by the present invention, by the heat conduction device formed by metal wires or metal strips, it can make better heat conduction, heating temperature of the organic material arranged at different portions be uniform such that the steady state of thermal equilibrium is achieved. And it can also fill more material, increase evaporation rate, decrease the number of refilling the material, and improve production efficiency.

BRIEF DESCRIPTION OF THE DRAWINGS

In order to more clearly illustrate the technical solution in the present invention or in the prior art, the following will illustrate the figures used for describing the embodiments or the prior art. It is obvious that the following figures are only some embodiments of the present invention. For the skilled persons of ordinary skill in the art without creative effort, it can also obtain other figures according to these figures.

DETAILED DESCRIPTION OF THE PREFERRED EMBODIMENT

The following content combines with the drawings and the embodiment for describing the present invention in detail.

Figure 1:
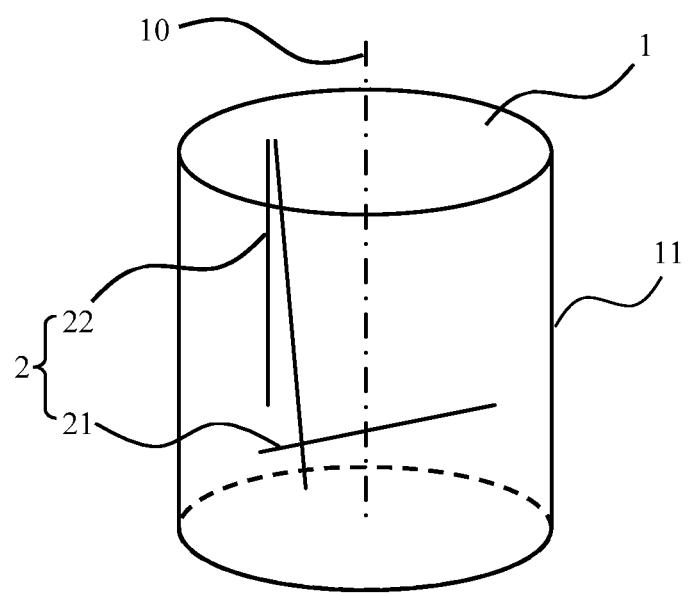
FIG. 1 is a schematic perspective drawing of a crucible of a coating machine according to an embodiment of the present invention.

In order to solve the deposition problem of the thermal conductive balls in the melt type material. With reference to FIG. 1, an embodiment of the present invention provides a crucible 1. The crucible 1 comprises a heat conduction device 2. The heat conduction device 2 comprises one or multiple radial metal wires or metal strips 21 disposed along a radial direction of the crucible 1, and one or multiple axial metal wires or metal strips 22 disposed along an axial direction of the crucible 1. Specifically, the radial metal wires or metal strips 21 are vertical to or substantially vertical to a main axis 10 of the crucible 1. The axial metal wires or metal strips 22 are parallel with or substantially parallel with the main axis 10 of the crucible 1.

The lengths of the metal wires or the metal strips and the angles between the metal wires or the metal strips and the main axis 10 of the crucible 1 are determined by the actual size and actual temperature difference of the crucible 1 to ensure optimal heat conduction. Because the conduction ability of the metal wires or metal strips is better than the organic material, disposing the heat conduction device 2 in the crucible 1 can make heating temperature of the organic material arranged at different portions of the crucible 1 be uniform such that the steady state of thermal equilibrium is increased. And it can also fill more material, increase evaporation rate, decrease the number of refilling the material, and improve production efficiency. At least one of the radial metal wires or metal strips 21 and the axial metal wires or metal strip 22 is contacted with an inner wall 11 of the crucible 1 to directly obtain thermal energy from the inner wall 11 of the crucible 1 to further increase the heat conduction efficiency.

Figure 2:
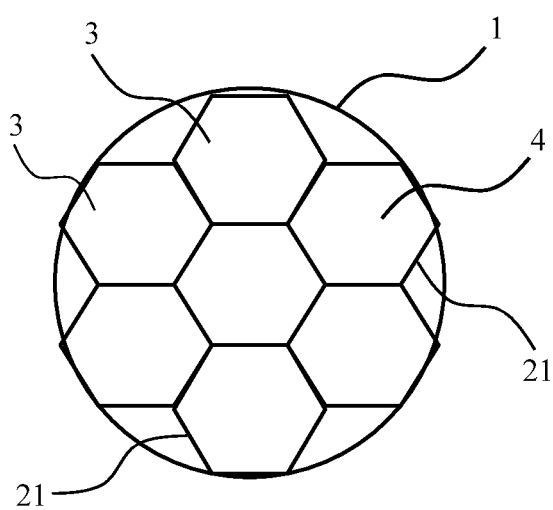
FIG. 2 is a schematic top view of the crucible of a coating machine according to an embodiment of the present invention.
Figure 3:
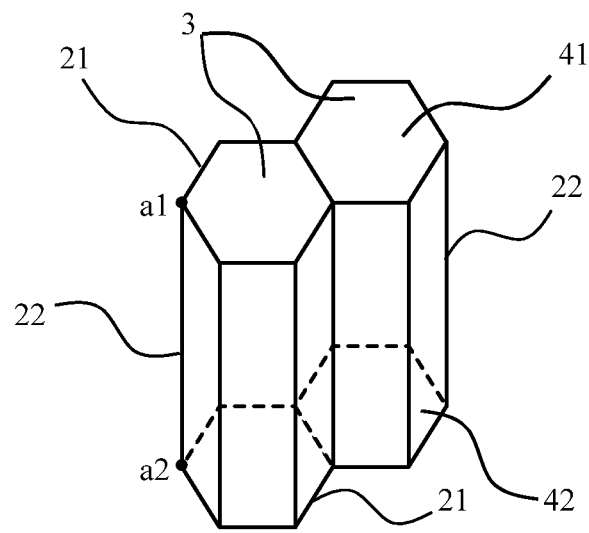
FIG. 3 is a schematic perspective drawing of a thermal conductive device of the crucible of a coating machine according to an embodiment of the present invention.

A shown in FIG. 2 for further improvement, the multiple radial metal wires or metal strips 21 disposed along the radial direction of the crucible 1 form a planar honeycomb structure 4 by at least two polygons 3 at a radial plane of the crucible 1. The planar honeycomb structure 4 is disposed hierarchically along the axial direction of the crucible 1. As shown in FIG. 3, the planar honeycomb structure 4 is disposed as two layers along the axial direction of the crucible, that is, an upper layer 41 and a lower layer 42 respectively. The multiple axial metal wires or metal strips 22 disposed along the axial direction of the crucible 1 are connected with intersections (for example, a1 and a2) corresponding to each side of the polygons 3 of the two adjacent layers of the planar honeycomb structure 4 in order to form a three-dimensional honeycomb structure.

Comparing with the thermal conduction device composed of the multiple scattered metal wires or metal strips as shown in FIG. 1. The thermal conduction device having three-dimensional honeycomb structure is more beneficial for reducing the temperature difference in the interior of the crucible 1 and convenient for removing or placing in because the structure of the thermal conduction device is regular so that the heat conduction at the radial direction and axial direction are more uniform in the interior of the crucible 1. In addition, the outermost metal wires or a metal strips can contact well with the inner wall 11 of the crucible 1 to directly obtain the heat energy from the inner wall 11 of the crucible 1 for improving the heat conduction efficiency in advance.

Specifically, the radial metal wires or metal strips 21 form the planar honeycomb structure 4 by weaving or welding. The axial metal wires or metal strips 22 are also connected with the intersections corresponding to the polygons 3 of the two adjacent layers of the planar honeycomb structure 4 by weaving or welding. The polygon 3 can be a pentagon, a hexagon, an octagonal or an irregular polygon. The size and the material of the metal wires or metal strips, the size of the thermal conduction device, and the size and the density of the honeycomb structure are determined by the actual size of the crucible and the actual temperature difference in the crucible to ensure the optimal heat conduction. Typically, the materials of the metal wires or metal strips are aluminum, aluminum alloy, titanium alloy, or copper alloy, etc.

If the crucible 1 is bigger, the temperature difference in the axial direction and the radial direction is greater. The metal wires or metal strips in the thermal conduction device 2 should utilize aluminum or aluminum alloy, which have better thermal conduction coefficient. If the grid of the thermal conduction device 2 having the honeycomb structure is denser, the thermal conduction is better. However, if the grid is too dense, the occupied volume is greater so that the organic material which can be filled into the crucible is less. This present embodiment uses the porosity rate P (The percentage of the volume of the internal pores of the honeycomb structure heat conduction device 2 to the total volume of heat conduction device 2) to define:

$$P = \frac{V_0 - V}{V_0} \times 100\%$$

Wherein, $V_0$ represents the total volume of the honeycomb structure heat conduction device 2; V represents the absolute compacting volume of the honeycomb structure heat conduction device 2 (i.e., the total volume of the metal wires or the metal strips). In this embodiment, 10%<P<99%, preferably, 80%<P<95%.

Figure 4:
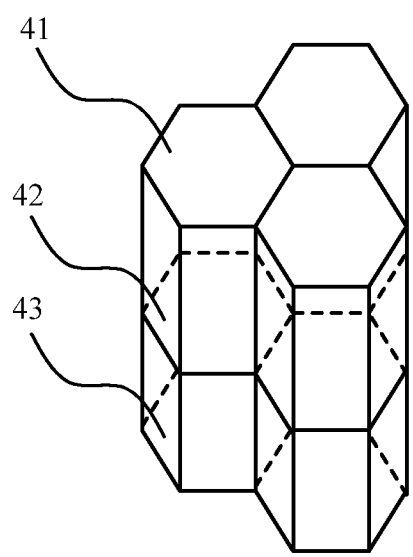
FIG. 4 is another schematic perspective drawing of a thermal conductive device of the crucible of a coating machine according to an embodiment of the present invention.

According to the actual size of the crucible 1, the honeycomb structure heat conduction device 2 also has a variety of structures correspondingly. For example, for the crucible 1 having elongated structure, which requires higher heat conduction uniformity in the axial direction so that it can dispose the three-dimensional honeycomb structure heat conduction device 2 with multiple layers. As shown in FIG. 4, the honeycomb structure heat conduction device 2 is formed by planar honeycomb structures 41~43 with three layers composed of radial metal wires or metal strips 21. The intersections of each hexagon which forms the planar honeycomb structure are connected with the axial metal wires or metal strips 22 to form the three-dimensional honeycomb structure. Therefore, in the axial direction of the crucible 1, it includes the upper, the middle, and the lower layer planar honeycomb structure 41~43 such that it can perform better heat conduction for the organic material among the planar honeycomb structure 41~43 to meet the heat conduction uniformity in the axial direction.

Figure 5:
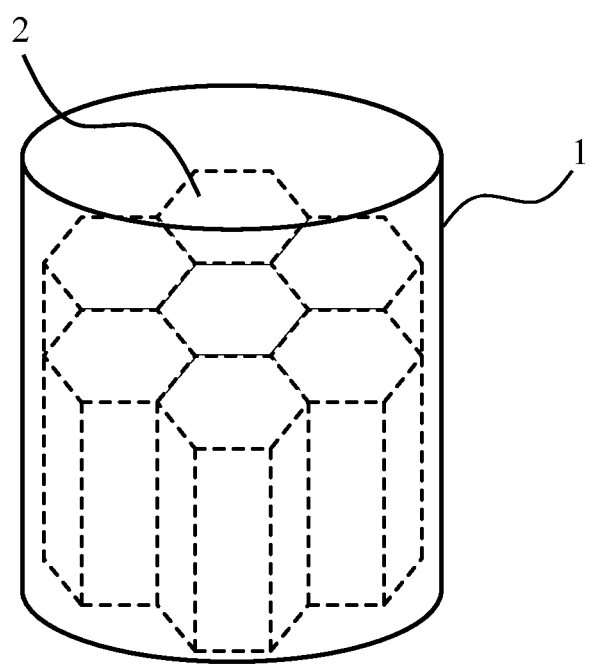
FIG. 5 is a schematic drawing illustrating the crucible of a coating machine installing with the thermal conductive device according to an embodiment of the present invention.

In another example, for the crucible 1 which requires higher heat conduction uniformity in the radial direction, it can dispose a planar honeycomb structure formed by more polygons as shown in FIG. 5. The planar honeycomb structure composed of seven hexagons is formed at the radial plane of the crucible 1 such that it is beneficial for the heat conduction in the radial direction. Of course, depending on the requirement for specific applications, it can also integrate the above situation to assemble an optimal heat conduction device, such as a heat conduction device 2 with multiple layers and multiple honeycomb structures.

The present invention solves the problem of the thermal conductive balls depositing in the melt type material. By the heat conduction device formed by metal wires or metal strips, it can make better heat conduction, heating temperature of the organic material arranged at different portions be uniform such that the steady state of thermal equilibrium is achieved. And it can also fill more material, increase evaporation rate, decrease the number of refilling the material, and improve production efficiency.

The above embodiments of the present invention are not used to limit the claims of this invention. Any use of the content in the specification or in the drawings of the present invention which produces equivalent structures or equivalent processes, or directly or indirectly used in other related technical fields is still covered by the claims in the present invention.

What is claimed is:

1. A crucible of a coating machine comprising:
   a heat conduction device installed inside the crucible, and having
      one or multiple radial metal wires or metal strips disposed along a radial direction of the crucible; and
      one or multiple axial metal wires or metal strips disposed along an axial direction of the crucible;
   wherein, the radial metal wires or metal strips are vertical to or substantially vertical to a main axis of the crucible, and the axial metal wires or metal strips are parallel with or substantially parallel with the main axis of the crucible;
   wherein, the multiple radial metal wires or metal strips form a planar honeycomb structure by at least two polygons at a radial plane of the crucible; and
   wherein, the planar honeycomb structure is disposed as at least two layers along the axial direction of the crucible, and the multiple axial metal wires or metal strips are connected with intersections corresponding to each side of the polygons of the two adjacent layers of the planar honeycomb structure in order to form a three-dimensional honeycomb structure.

2. The crucible of a coating machine according to claim 1, wherein, the radial metal wires or metal strips form the planar honeycomb structure by weaving or welding, and the axial metal wires or metal strips are connected with the intersections corresponding to each side of the polygons of the two adjacent layers of the planar honeycomb structure by weaving or welding in order to form the three-dimensional honeycomb structure.

3. The crucible of a coating machine according to claim 1, wherein, a percentage P of a volume of internal pores of the heat conduction device to a total volume of the heat conduction device satisfies: 10%<P<99%.

4. The crucible of a coating machine according to claim 3, wherein, 80%<P<95%.

5. The crucible of a coating machine according to claim 1, wherein, at least one of the radial metal wires or metal strips and the axial metal wires or metal strips is contacted with an inner wall of the crucible.

6. The crucible of a coating machine according to claim 5, wherein, the materials of the radial metal wires or metal strips and the axial metal wires or metal strips are aluminum, aluminum alloy, titanium alloy, or copper alloy.

7. The crucible of a coating machine according to claim 1, wherein, the polygon is a pentagon, a hexagon, an octagonal or an irregular polygon.

8. A crucible of a coating machine comprising:
   a heat conduction device installed inside the crucible, and having
      one or multiple radial metal wires or metal strips disposed along a radial direction of the crucible; and
      one or multiple axial metal wires or metal strips disposed along an axial direction of the crucible;
   wherein, the multiple radial metal wires or metal strips form a planar honeycomb structure by at least two polygons at a radial plane of the crucible; the planar honeycomb structure is disposed as at least two layers along the axial direction of the crucible; the multiple axial metal wires or metal strips are connected with intersections corresponding to each side of the polygons of the two adjacent layers of the planar honeycomb structure in order to form a three-dimensional honeycomb structure.

* * * * *